United States Patent [19]
Ware et al.

[11] Patent Number: 5,446,696
[45] Date of Patent: Aug. 29, 1995

[54] METHOD AND APPARATUS FOR IMPLEMENTING REFRESH IN A SYNCHRONOUS DRAM SYSTEM

[75] Inventors: Frederick A. Ware, Los Altos Hills; James A. Gasbarro, Mountain Vew; John B. Dillon, Palo Alto; Michael P. Farmwald, Portola Valley; Mark A. Horowitz, Palo Alto; Matthew M. Griffin, Mountain View, all of Calif.

[73] Assignee: Rambus, Inc., Mountain View, Calif.

[21] Appl. No.: 347,770

[22] Filed: Dec. 2, 1994

Related U.S. Application Data

[63] Continuation of Ser. No. 68,758, May 28, 1993, abandoned.

[51] Int. Cl.⁶ .............................................. G11G 7/00
[52] U.S. Cl. .................... 365/222; 365/212; 365/227
[58] Field of Search .............. 365/222, 227, 226, 212

[56] References Cited

U.S. PATENT DOCUMENTS

| | | | |
|---|---|---|---|
| 3,796,998 | 3/1974 | Appelt | 340/173 |
| 3,800,295 | 3/1974 | Anderson, Jr. et al. | 340/173 |
| 4,249,247 | 2/1981 | Patel | 365/222 X |
| 4,393,477 | 7/1983 | Murotani | 365/222 |
| 4,453,237 | 6/1984 | Reese | 365/222 |
| 4,459,660 | 7/1984 | Bellay | 365/222 X |
| 4,631,701 | 12/1986 | Kappeler | 365/222 X |
| 4,682,306 | 7/1987 | Sakurai | 365/222 |
| 4,716,551 | 12/1987 | Inagaki | 365/222 |
| 4,881,205 | 11/1989 | Aihara | 365/222 |
| 4,901,283 | 2/1990 | Hanbury | 365/222 |
| 5,262,998 | 11/1993 | Mnich | 365/222 |

FOREIGN PATENT DOCUMENTS

PCT/US94/-
05827 5/1994 WIPO.

OTHER PUBLICATIONS

IBM Technical Disclosure Bulletin, vol. 32, No. 8B, Jan. 1990, pp. 223-224, "Synchronous Memory Refresh Scheme Which Supports Several Refresh Rates Without Jumpers on Cards or Planars."

*Primary Examiner*—David C. Nelms
*Assistant Examiner*—Son Mai
*Attorney, Agent, or Firm*—Blakely, Sokoloff, Taylor & Zafman

[57] ABSTRACT

A synchronous DRAM system with internal refresh is controlled by a refresh signal issued by an oscillator or memory controller coupled to the DRAM. By locating the oscillator on the processor or memory controller better control of the frequency of refresh is achieved, particularly, as the signal can be derived from a crystal which is not sensitive to variations in operating conditions. The oscillator drives a refresh signal on a bus or signal line to the DRAM, such that the refresh address counter is incremented and the row identified by the refresh address counter is refreshed.

10 Claims, 6 Drawing Sheets

METHOD AND APPARATUS FOR IMPLEMENTING REFRESH IN A SYNCHRONOUS DRAM SYSTEM

This is a continuation of application Ser. No. 08/068,758, filed May 28, 1993 now abandoned.

BACKGROUND OF THE INVENTION

1. Field of the Invention

The present invention relates to a method and apparatus for refreshing synchronous dynamic random access memory in a system.

2. Art Background

Dynamic random access memory (DRAM) components provide an inexpensive solid state storage technology for today's digital systems. The digital information is maintained in the form of charge stored on a two dimensional array of capacitors. To access the DRAM array, a row address is provided (and held in a latch). This address selects one of the rows of the DRAM by selecting one of the word lines of the array. The other word lines are de-selected. In the case of a write operation, the contents of the column amplifiers are restored to the row of capacitors through the selected row of transistors. In the case of a read operation, the contents of the row of capacitors is sent through the selected row of transistors and the bit lines to the column amplifiers.

The sensing operation performed during a read operation is destructive, requiring the row of capacitors to be rewritten with a restore operation. The column amplifiers are latching so their contents are not destroyed when they are restored to the selected row of capacitors. The charge on each capacitor is not only destroyed during a sense operation, but is also steadily lost over time due to leakage mechanisms. This leakage current depends upon processing and operating conditions, so there is a variation from component to component as well as a variation between storage cells of a single component. The leakage current is also strongly dependent upon temperature (higher temperature causes higher leakage) and is weakly dependent upon the supply voltage used by the component. Because of the leakage, the storage cells must have their charge refreshed periodically. For example, the timing parameter $t_{ref,max}$ is used to denote the interval over which every cell must be read and written back at least once to guarantee proper data retention. An illustrative diagram of the internal structure of a DRAM is shown in FIGS. 1a and 1b.

There are two types of DRAMs: synchronous and asynchronous. In a synchronous DRAM, the time base is shared between the controller/processor and the DRAM component and is independent of the control signals sent to the DRAM. In an asynchronous DRAM, the control signals communicate the timing information in an asynchronous manner.

In a synchronous system, the DRAM may operate in a power down state. Power down is a state in which the component operates at lower power and does not operate synchronously because the internal clocks are not operating.

Refresh can be achieved a number of ways. In one method, referred to herein as an external process, the time base, which is the source of the timer for performing refresh, and the refresh row address counter are external to the DRAM. In a second method, referred to as an internal refresh process, both the time base and refresh row address counter are internal to the DRAM. In a third process referred to as a mixed refresh process, the time base is external and the refresh row address counter is internal to the DRAM.

FIG. 2 shows an asynchronous DRAM with external refresh and a memory system with the control, address and data wires which connect the DRAM to the processor or memory controller component. In this example, the DRAM uses an asynchronous interface. There are no clocks applied from the external system; the DRAM generates its own internal clocks when the control signals are pulsed. A read or write access begins by transmitting a row address on the address wires and by asserting the RAS control signal to latch the address inside the DRAM. The assertion of the row address causes the desired row to be sensed by the column amplifiers. After the assertion of the RAS control signal, the column address is transmitted on the multiplexed address wires and the CAS control signal is asserted so that the address is latched. This address selects the desired data word from the sensed row. This word is transmitted back to the processor or memory controller in the case of a read access. In the case of a write access, the information on the data wires is written into the column amplifiers and the modified row is restored back into the memory array. Typically a read access can be used to perform refresh operations, but is not optimal since it involves the transfer of a column address which is not utilized.

External refresh is typically achieved by transmitting only a row address and asserting RAS. This will cause the rows to be sensed and restored and can be done in a minimal amount of time. One drawback to external refresh is that it requires a count value identifying the current row being refreshed to be held in the processor or memory controller. Some types of asynchronous DRAMs with mixed refresh include a refresh address counter. A dedicated signal or a combination of existing signals (RAS, CAS) are used to cause a refresh of the row address in this counter and to increment the counter.

FIG. 3 shows a synchronous DRAM which is in a powered up state. The DRAM utilizes mixed refresh which includes the refresh address counter in the DRAM. While in the power up state, the synchronous DRAM can support either external or mixed refresh. Synchronous interfaces are desirable as information is transferred at a higher rate. However, synchronous interfaces also require more power than asynchronous interfaces. The power consumption increase is due to a clock signal which is received by the DRAM which dissipates AC power while it is running. The synchronous DRAMs use synchronous control signals to initiate a refresh of the row the address, which is located in the refresh address counter, just as in any asynchronous DRAM with a refresh address counter.

An important application area for DRAMs is in portable computing systems. This requires that the DRAMs are capable of holding information in storage cells for extended periods of time with minimal power consumption. The energy cost of powering up the synchronous interface to perform refresh is too high. One answer to these requirements is to provide internal refresh in a power down state. It is possible to disable the internal clock to avoid dissipating the synchronous interface power, but this prevents the synchronous signals from being used. A refresh address counter may be included in the DRAM along with an oscillator to drive it. When refresh mode is entered, the DRAM interface is powered down and only the oscillator operates. At periodic intervals, for example $t_{ref,max}/n_{row}$ (where $n_{row}$ is the number of rows in the DRAM), the refresh address counter is incremented and the selected row is sensed and restored. A block diagram illustration of a synchronous DRAM with internal refresh in the power down state is shown in FIG. 4.

However, there are disadvantages with placing the oscillator inside the DRAM for the low power refresh mode. Typically this oscillator is implemented using transistors and capacitors with some coarse adjustment capability (e.g., using polysilicon programming fuses) at testing time. Such a circuit will produce a wide range of oscillator period across the range of processing conditions and a wide range of oscillator period across operating conditions, such as temperature and voltage. Further, the minimum refresh period, which the oscillator is attempting to duplicate, will produce a larger variation across processing conditions and an even larger, but more predictable variation with temperature. In practice, the $t_{ref,max}$ parameter is guaranteed by testing for all the storage cells at the worst case temperature for the DRAM. The maximum oscillator period parameter, $t_{osc,max}$, is padded with sufficient margin such that $t_{osc,max}$ is less than $t_{ref, max}/n_{row}$. Thus, the following relationship must be satisfied:

$$t_{osc,min} < t_{osc,max} < t_{ref,max}/n_{row}.$$

As discussed above, the minimum oscillator period, $t_{osc,min}$, value can be as much as three to ten times less than the $t_{ref,max}/n_{row}$ value when the range of processing conditions and operating conditions are considered, indicating that the DRAM is refreshing more often than it needs to and therefore dissipating more power than necessary. Furthermore, the $t_{ref,max}$ value will typically increase by some geometric factor, for example, $2\times$, for every 10° drop in the ambient temperature. This means that in cooler systems the $t_{ref,max}$ value is higher making the mismatch between $t_{osc,max}$ and $t_{ref,max}$ in the above equation even greater.

At the system level, bringing the synchronous DRAM into and out of the power down state causes a latency to occur due to the need to synchronize the internal refresh mechanism with the synchronous interface.

SUMMARY OF THE INVENTION

A significant reduction in power dissipation can be accomplished if the oscillator period is better matched to the $t_{ref,max}$ parameter indicative of the frequency of refresh. This can be accomplished by moving the oscillator from the DRAM to the processor or memory controller coupled to the DRAM. The oscillator implemented on the processor or memory controller preferably will use a time base derived from precise time base, such as a crystal, which has small sensitivity to operating conditions. This permits the $t_{osc,min}$ and $t_{osc,max}$ values to be controlled to be effectively the same. The oscillator drives a refresh signal on a wire which connects to a portion of the DRAM interface that is maintained operational while the synchronous interface is in the power down state. The refresh address counter remains located on the DRAMs in order to minimize information which must flow from the processor or memory controller to the DRAMs. Furthermore, with this architecture it is possible to measure the ambient temperature with sensors accessible to the processor or memory controller and use this information to adjust the oscillator on the controller so that it matches the $t_{ref,max}$ of the DRAMs at that temperature. This is more optimal as only one sensor is required for the entire system, as opposed to prior methods where a temperature sensor would have to be provided for each DRAM.

BRIEF DESCRIPTION OF THE DRAWINGS

The objects, features and advantages of the present invention will become apparent to one skilled in the art from the following detailed description in which.

DETAILED DESCRIPTION OF THE INVENTION

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

To better control the refresh in a synchronous DRAM system, the oscillator is moved to be located on the processor or memory controller. The refresh signal generated by the oscillator is then input to the DRAM through a signal line such as a bus signal line. The DRAM includes logic for tracking the row being refreshed and enabling the necessary logic to refresh each row. The oscillator signal generated on the processor or memory controller is preferably derived from precise time base, such as a crystal, which has small sensitivity to operating conditions. This permits the parameter $t_{osc,min}$ and $t_{osc, max}$ values to be controlled to be effectively the same. As most systems maintain a real time clock even in their deepest power down state, there will be a convenient time base for the refresh clock on the processor. The oscillator drives a refresh signal on a wire which connects to a small portion of the DRAM interface which remains in an awake or operational state. However, not all the refresh logic is moved to the processor. In order to minimize the amount of information which is communicated between the processor and the DRAMs, the refresh address counter and associated logic is maintained on the DRAM. Furthermore, with the oscillator located on the processor, it is possible to measure the ambient temperature with sensors accessible by the processor or memory controller and use this information to adjust the oscillator output so it matches the $t_{ref,max}$ of the DRAMs at that particular temperature. This approach is cost effective because only one temperature sensor is required for the entire system which may include multiple DRAMs. In addition, the computation of the best refresh internal may be complex; therefore, it is more cost effective to perform this computation centrally.

Furthermore, central control provides more efficient entry to and exit from the power down state. Finally, central control can provide for the grouping of refreshes in a precise manner. For example, grouping lines in a burst permits the system to optimally uses power and also optimally use the DRAM for other memory DRAMs.

Figure 1A:
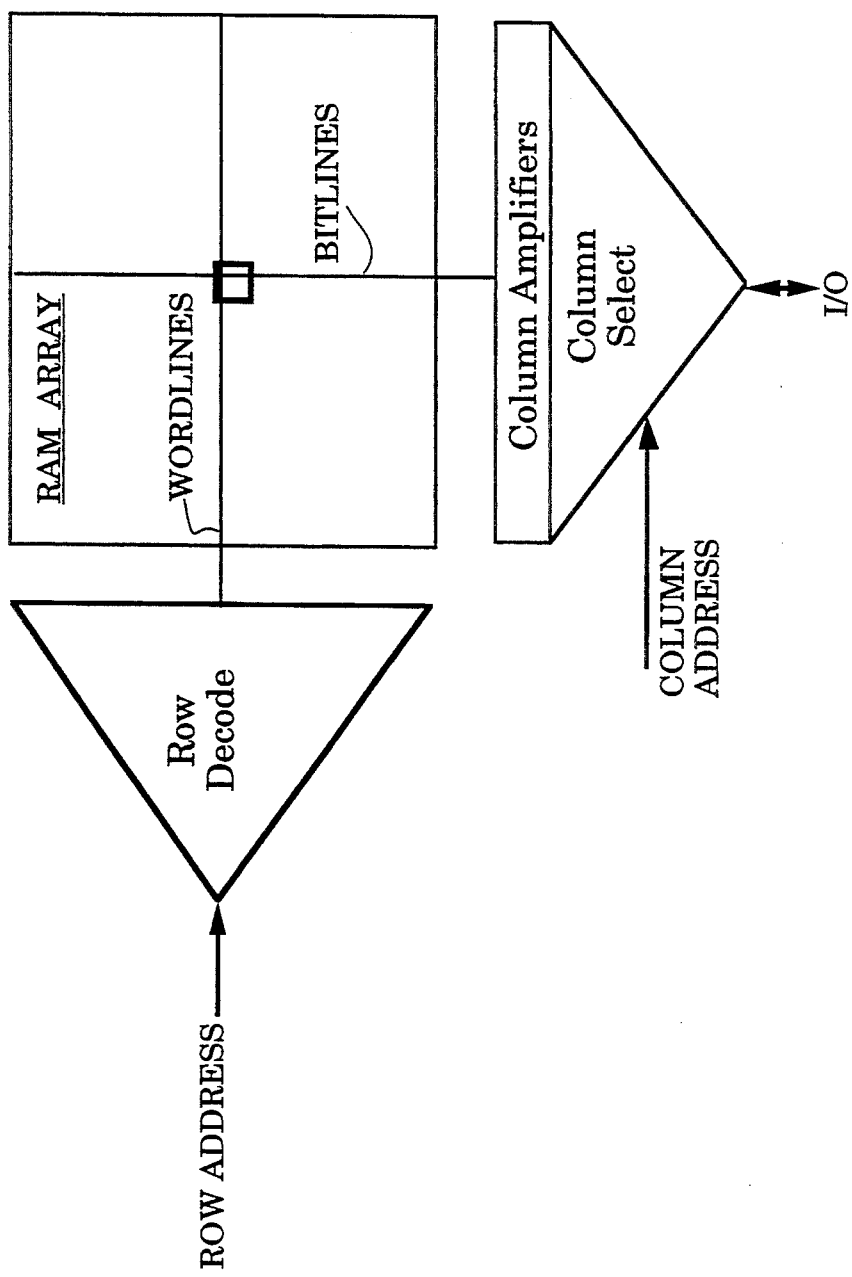
FIGS. 1a and 1b are a block diagram illustrations of a prior art internal structure of a DRAM.
Figure 1B:
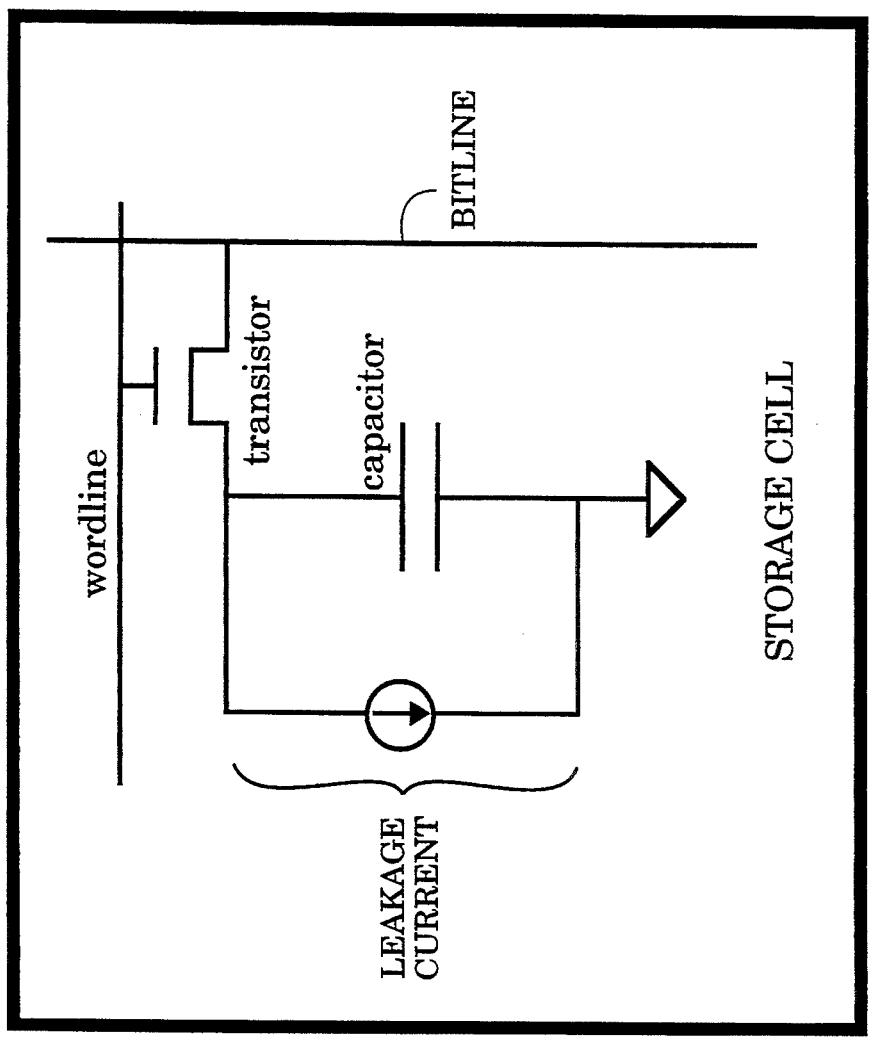
Figure 2:
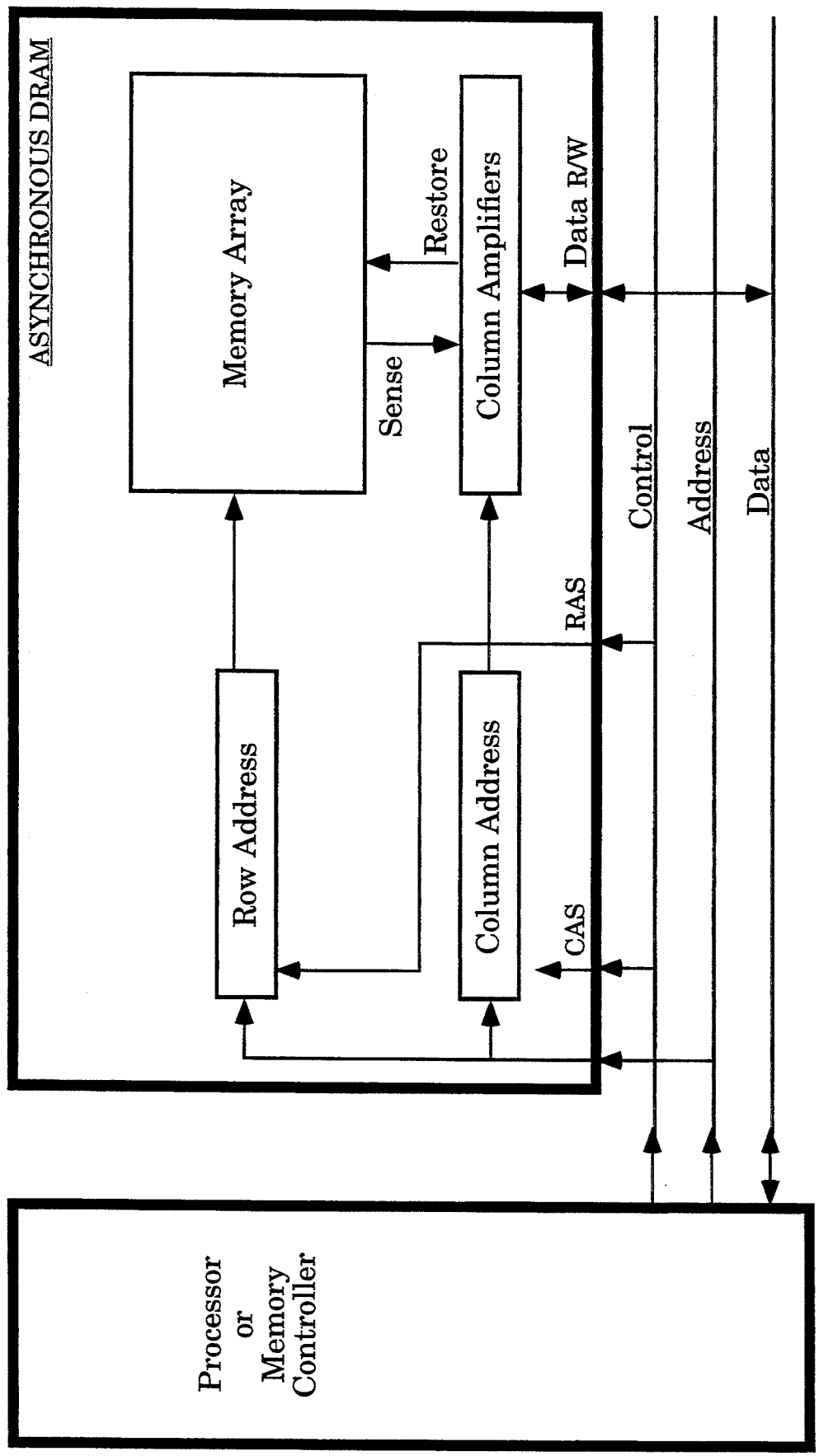
FIG. 2 is a block diagram illustration of a prior art asynchronous DRAM with external refresh coupled to a processor or memory controller.
Figure 3:
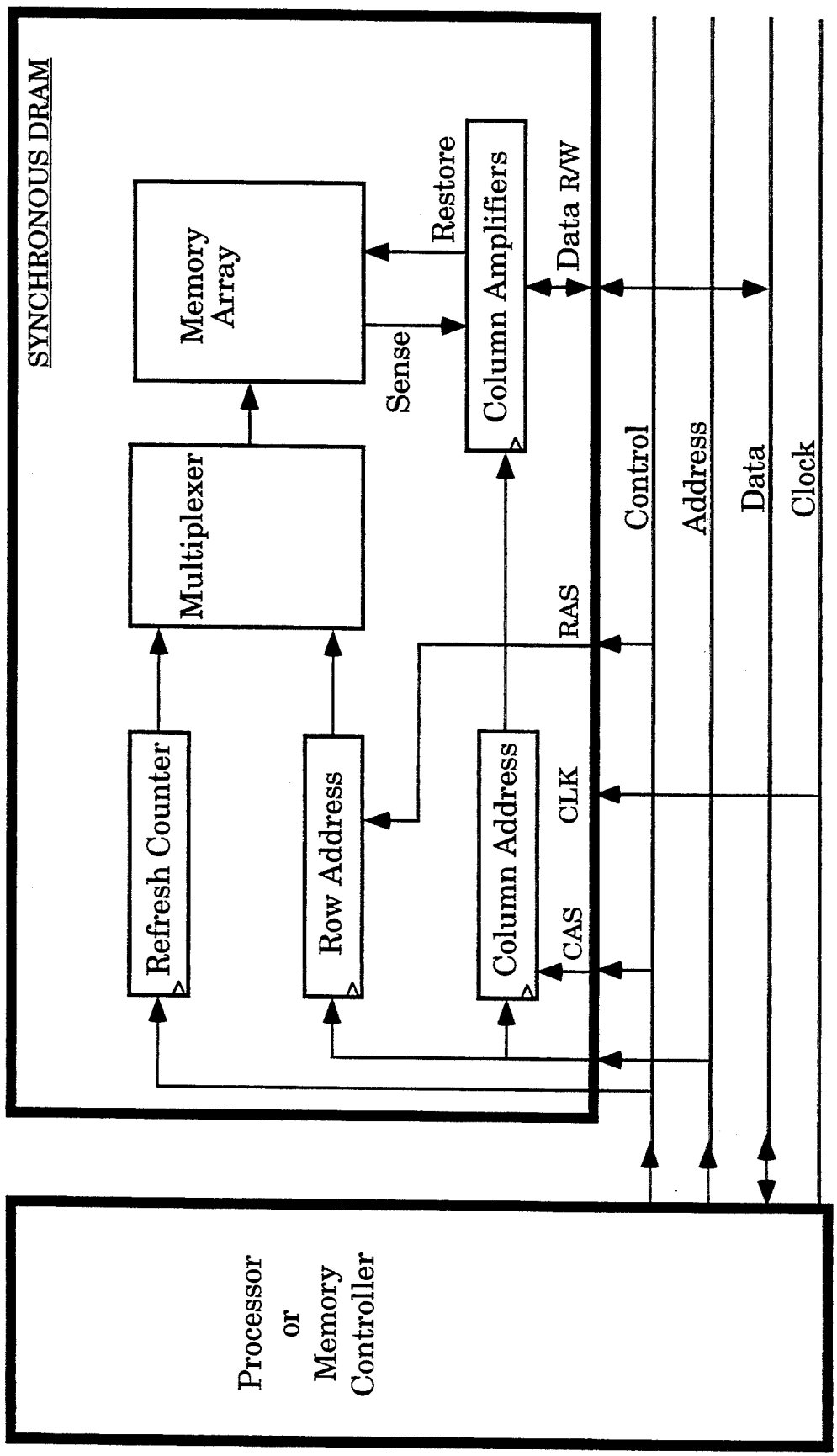
FIG. 3 is a block diagram illustration of a prior art synchronous DRAM which is in a powered up state and utilizes mixed refresh that includes logic for performing refresh in the DRAM.
Figure 4:
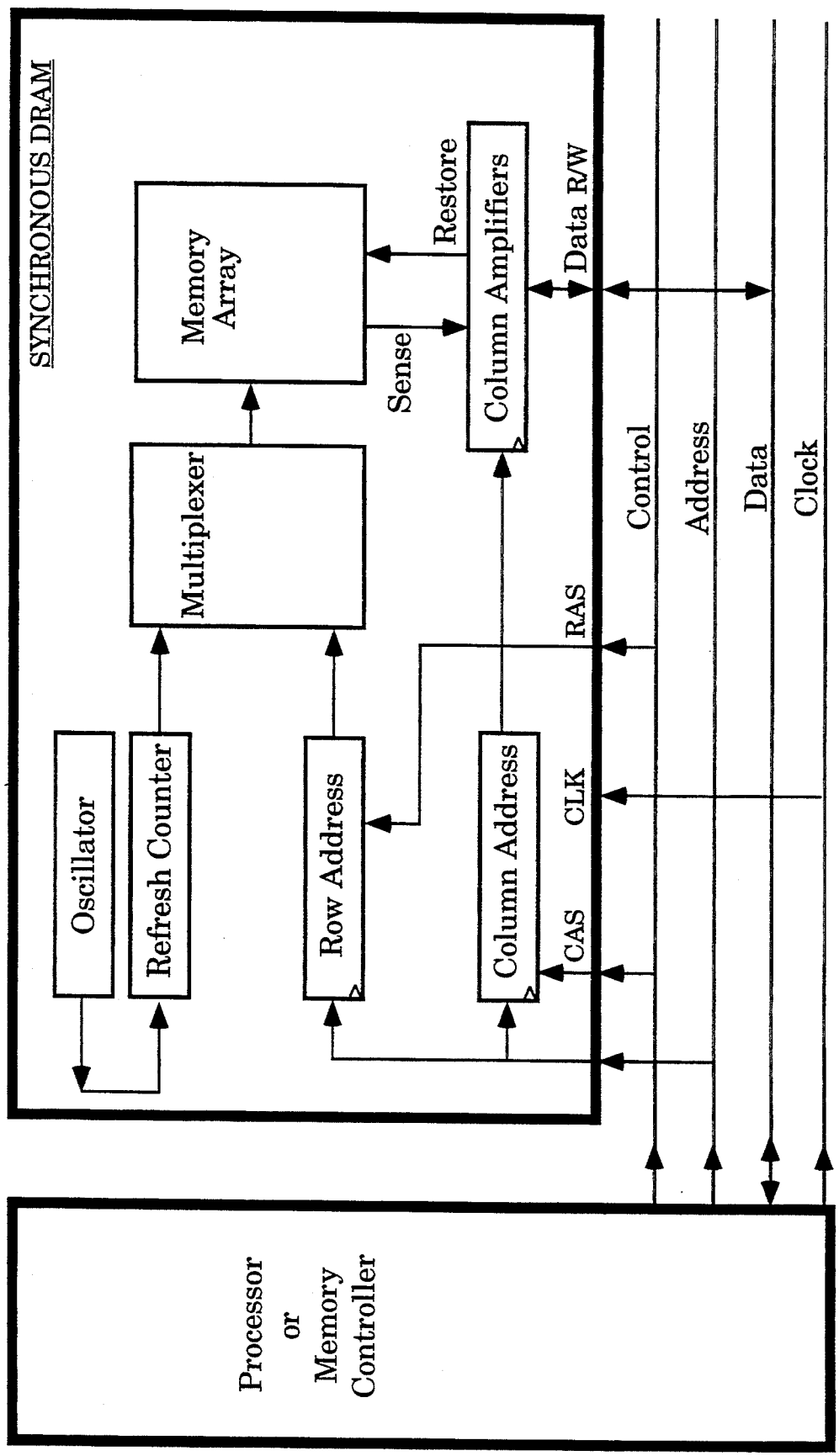
FIG. 4 is a block diagram illustration of a prior art synchronous DRAM in the power down state with internal refresh.
Figure 5:
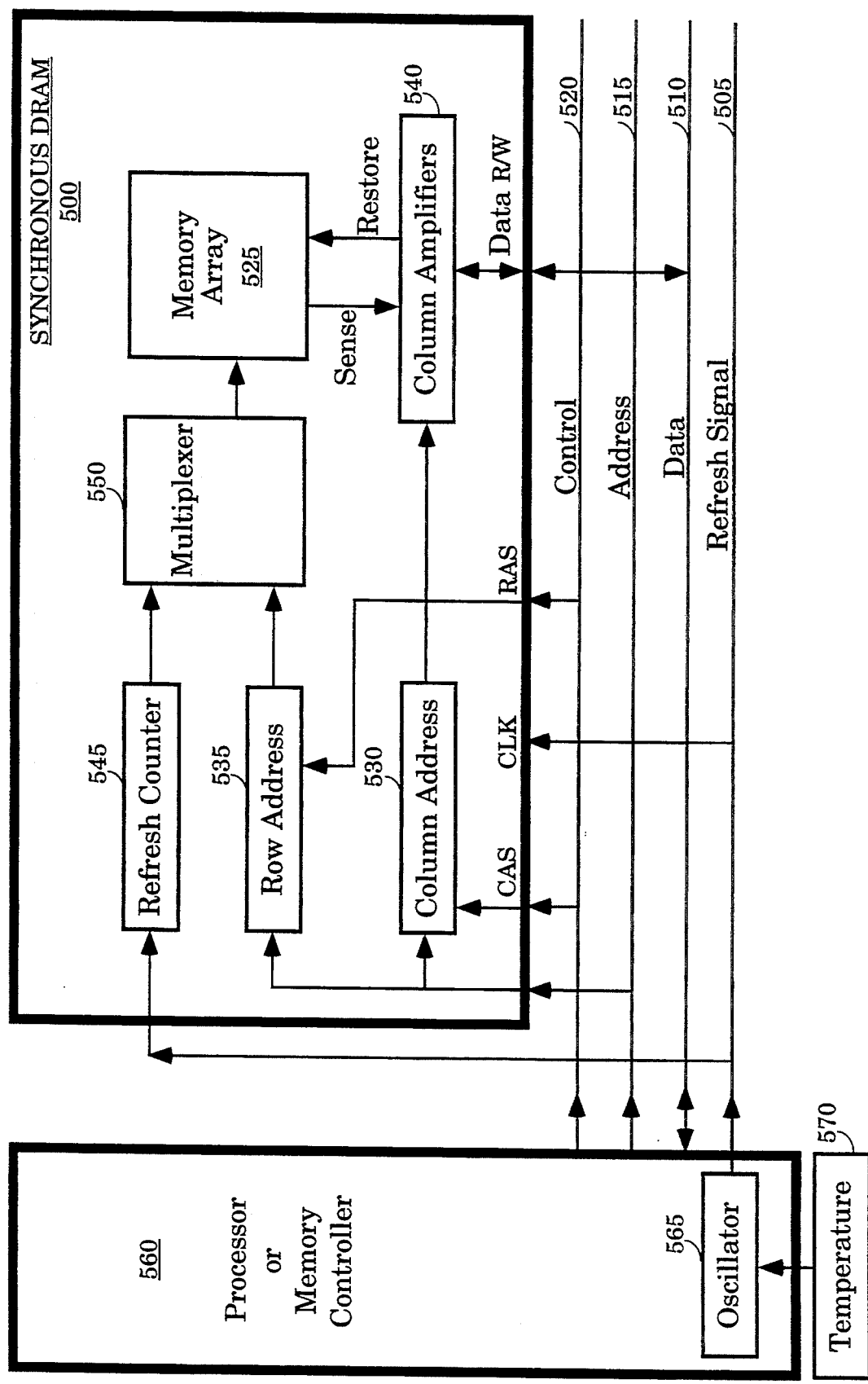
FIG. 5 is a block diagram of the DRAM of the present invention.

A block diagram illustration of the DRAM of the present invention is illustrated in FIG. 5. The DRAM 500 is connected through signal lines, such as a bus structure 505, 510, 515, 520. The DRAM includes memory array 525, column address 530, row address register 535, column amplifiers 540, a refresh address counter 545 and multiplexer 550. The refresh address counter 545 is used to identify the row currently being refreshed. The refresh address counter is multiplexed with the row address register 535 by multiplexer 550 to provide a row address to the memory array 525.

The processor or memory controller 560 includes oscillator 565 which generates the refresh signal 505 that is input to the DRAM 500 to increment the refresh address counter 545 for refreshing a particular row. Preferably the oscillator signal is derived from a precise time base which has a small sensitivity to operating conditions. In addition, as most portable systems maintain a real time clock even when in the deepest power down state, the processor clock provides a convenient time base for generation of a refresh clock. Even during low power down operating conditions, portions of the DRAM will be maintained in an awake or power-on state. In particular, the refresh address counter 545 will be enabled such that the refresh signal 505, output by oscillator 565, will be received by the refresh address counter 545 to cause the refresh of the identified row. The refresh address counter 545 is located on the DRAM since it is important to minimize the information which must flow from the processor or memory controller 560 to the DRAM 500. It should be noted that the refresh signal line 505 could be designed to perform other functions and transmit other signals between the processor and the DRAM when the DRAM is not in the low power mode.

In an alternate embodiment, a temperature sensor 570 is attached to the processor or memory controller 560 to measure the ambient temperature to adjust the oscillator so that it matches the $t_{ref,max}$ of the DRAMs at that temperature. This approach is cost effective when the oscillator is located on the processor, since only one temperature sensor is needed for the processor as opposed to providing a sensor for each DRAM.

The invention has been described in conjunction with the preferred embodiment. It is evident that numerous alternatives, modifications, variations and uses will be apparent those skilled in the art in light of the foregoing description.

What is claimed is:

1. A synchronous dynamic random access memory (DRAM) system, the DRAM system comprising a normal operating state and a power down state, during said power down state devices of the DRAM are powered down to minimize consumption of power, said system performing mixed refresh while in the power down state, said system comprising:

at least one synchronous DRAM comprising;
  a memory array of elements,
  a row address register for receiving a row address of a memory element in the array to be accessed,
  column amplifiers for sensing the row of the memory array identified by the received row address and storing the row sensed,
  a refresh address counter incremented by a refresh signal and identifies a row to be refreshed, said refresh address counter maintained in an awake state such that when the DRAM is in the power down state, the refresh address counter is incremented to cause a refresh of the row identified by the refresh address counter;
a precise time base device for generating a refresh signal when the DRAM is in a power down state; and
communication means for communicating the refresh signal from the time base device directly to the refresh address counter of the DRAM when in a power down state to increment the refresh address counter and cause at least one row identified by the refresh address counter to be refreshed by the column amplifiers sensing the row and restoring the row of memory;
wherein data in the memory array are refreshed when the DRAM is in the power down state.

2. The synchronous DRAM system as set forth in claim 1, wherein the precise time base device is located in the processor.

3. The synchronous DRAM system as set forth in claim 1, wherein the precise time base device comprises a crystal for generating the refresh signal at a predetermined frequency.

4. The synchronous DRAM system as set forth in claim 1, wherein the system comprises a plurality of DRAMs and the communication means communicates the refresh signal generated to the refresh address counter in each of the DRAMs such that at least one row in each of the DRAMs is refreshed by receipt of the refresh signal.

5. The synchronous DRAM system as set forth in claim 1, wherein the precise time base device comprises an oscillating device which generates the refresh signal and a temperature sensor coupled to the oscillating device to adjust the frequency of the refresh signal generated by the oscillating device according to temperature variations which vary the frequency the array requires refresh during the DRAM power down state.

6. The synchronous; DRAM system as set forth in claim 2, wherein the processor further comprises a means for grouping refresh signals in a burst to refresh a plurality of rows.

7. The synchronous DRAM system as set forth in claim 1, wherein the precise time base device is included in a memory controller.

8. In a synchronous DRAM system comprising a memory controller means and at least one DRAM comprising a plurality of memory elements, the DRAM system comprising a normal operating state and a power down state, during said power down state devices of the DRAM are powered down to minimize consumption of power, a method for performing a mixed refresh of the memory elements while the DRAM is in a power down state, comprising the steps of:

maintaining a refresh counter in an awake state when the DRAM is in a power down state;

generating a refresh signal at the memory controller, the frequency of the refresh signal corresponding to the frequency at which a row of the memory array requires refresh;

communicating the refresh signal to the refresh counter of the DRAM;

incrementing the refresh address counter upon receipt of the refresh signal;

refreshing the row identified by the refresh address counter.

9. The method as set forth in claim 8, further comprising the steps of:

sensing temperature at the memory controller; and adjusting the frequency of the refresh signal in according to the temperature sensed, said adjustment accounting for the frequency of refresh of the memory array required at the sensed temperature.

10. In a synchronous DRAM system comprising a memory controlling means and at least one DRAM comprising a plurality of memory elements, the DRAM system comprising a normal operating state and a power down state, during said power down state devices of the DRAM are powered down to minimize consumption of power, a method for performing mixed refresh of the memory elements while the DRAM is in power down state, comprising the steps of:

maintaining a refresh counter in an awake state when the DRAM is in a power down state;

generating a plurality of refresh signals at the memory controlling means;

communicating in a burst the refresh signals to the refresh counter of the DRAM; and incrementing the refresh counter in the DRAM and refreshing each row identified by the refresh counter for each refresh signal received in the burst.

* * * * *